(12) United States Patent
Kamei et al.

(10) Patent No.: US 7,551,482 B2
(45) Date of Patent: Jun. 23, 2009

(54) METHOD FOR PROGRAMMING WITH INITIAL PROGRAMMING VOLTAGE BASED ON TRIAL

(75) Inventors: Teruhiko Kamei, Yokohama (JP); Yan Li, Milpitas, CA (US)

(73) Assignee: SanDisk Corporation, Milpitas, CA (US)

( * ) Notice: Subject to any disclaimer, the term of this patent is extended or adjusted under 35 U.S.C. 154(b) by 110 days.

(21) Appl. No.: 11/616,647

(22) Filed: Dec. 27, 2006

(65) Prior Publication Data
US 2008/0158979 A1 Jul. 3, 2008

(51) Int. Cl.
*G11C 16/04* (2006.01)
(52) U.S. Cl. ............... 365/185.19; 365/185.24; 365/185.03; 365/185.21
(58) Field of Classification Search ............ 365/185.19, 365/185.24, 185.03, 185.21
See application file for complete search history.

(56) References Cited

U.S. PATENT DOCUMENTS

| 4,357,685 A | * | 11/1982 | Daniele et al. ......... 365/185.19 |
| 4,627,027 A | | 12/1986 | Rai |
| 5,220,531 A | | 6/1993 | Blyth |
| 5,280,446 A | | 1/1994 | Ma |
| 5,386,422 A | | 1/1995 | Endoh |
| 5,412,601 A | | 5/1995 | Sawada |
| 5,570,315 A | | 10/1996 | Tanaka |
| 5,623,442 A | | 4/1997 | Gotou |
| 5,712,815 A | | 1/1998 | Bill |
| 5,729,494 A | | 3/1998 | Gotou |
| 5,761,222 A | | 6/1998 | Baldi |
| 5,774,397 A | | 6/1998 | Endoh |
| 5,801,989 A | | 9/1998 | Lee |
| 5,812,457 A | * | 9/1998 | Arase ................... 365/185.22 |
| 5,870,334 A | | 2/1999 | Hemink |
| 5,909,387 A | * | 6/1999 | Wong et al. ................ 365/45 |
| 5,912,836 A | | 6/1999 | Liu |
| 5,943,260 A | | 8/1999 | Hirakawa |
| 5,949,714 A | | 9/1999 | Hemink |
| 5,969,990 A | | 10/1999 | Arase |
| 6,046,935 A | | 4/2000 | Takeuchi |
| 6,125,052 A | | 9/2000 | Tanaka |
| 6,192,445 B1 | | 2/2001 | Rezvani |

(Continued)

FOREIGN PATENT DOCUMENTS

EP    1227501    7/2002

(Continued)

OTHER PUBLICATIONS

Hosono, et al., A High Speed Failure Bit Counter for the Pseudo Pass Scheme (PPS) in Program Operation for Giga Bit NAND Flash, Toshiba Corporation, pp. 23-26, 2002.

(Continued)

*Primary Examiner*—Thong Q Le
(74) *Attorney, Agent, or Firm*—Vierra Magen Marcus & DeNiro LLP

(57) ABSTRACT

A trial programming process is performed for a first set of one or more non-volatile storage elements to test usage of the non-volatile storage system. Based on this trial programming, a programming signal is calibrated by adjusting its initial magnitude. The calibrated programming signal is then used to program a second set of non-volatile storage elements (which may or may not include the first set).

31 Claims, 10 Drawing Sheets

U.S. PATENT DOCUMENTS

| | | |
|---|---|---|
| 6,222,762 B1 | 4/2001 | Guterman |
| 6,266,270 B1 | 7/2001 | Nobukata |
| 6,301,151 B1 | 10/2001 | Engh |
| 6,301,161 B1 | 10/2001 | Holzmann |
| 6,424,566 B1 | 7/2002 | Parker |
| 6,456,528 B1 | 9/2002 | Chen |
| 6,522,580 B2 | 2/2003 | Chen |
| 6,525,964 B2 | 2/2003 | Tanaka |
| 6,529,412 B1 | 3/2003 | Chen |
| 6,735,114 B1 | 5/2004 | Hamilton |
| 6,738,289 B2 | 5/2004 | Gongwer |
| 6,859,397 B2 | 2/2005 | Lutze |
| 6,888,758 B1 | 5/2005 | Hemink |
| 6,917,542 B2 | 7/2005 | Chen |
| 6,924,663 B2 | 8/2005 | Masui |
| 7,023,737 B1 | 4/2006 | Wan |
| 7,092,290 B2 | 8/2006 | Hemink |
| 7,254,071 B2 | 8/2007 | Tu |
| 2002/0118574 A1 | 8/2002 | Gongwer |
| 2002/0191444 A1* | 12/2002 | Gregori et al. ......... 365/185.19 |
| 2003/0112663 A1 | 6/2003 | Quader |
| 2003/0147278 A1 | 8/2003 | Tanaka |
| 2004/0109362 A1 | 6/2004 | Gongwer |
| 2004/0255090 A1 | 12/2004 | Guterman |
| 2005/0024939 A1 | 2/2005 | Chen |
| 2005/0083735 A1 | 4/2005 | Chen |
| 2006/0126390 A1 | 6/2006 | Gorobets |
| 2006/0221692 A1 | 10/2006 | Chen |
| 2006/0274583 A1 | 12/2006 | Lutze |
| 2007/0159888 A1* | 7/2007 | Tu et al. ................ 365/185.21 |
| 2007/0159891 A1* | 7/2007 | Tu et al. ................ 365/185.24 |
| 2007/0253248 A1* | 11/2007 | Maayan et al. ........... 365/185.2 |

FOREIGN PATENT DOCUMENTS

| | | |
|---|---|---|
| EP | 1333445 | 8/2003 |
| EP | 1341185 | 9/2003 |
| WO | 9641346 | 12/1996 |
| WO | 9828745 | 7/1998 |
| WO | 2005024939 | 3/2005 |
| WO | 2005073975 | 8/2005 |
| WO | 2008/033679 | 3/2008 |

OTHER PUBLICATIONS

Choi, et al., A Novel Booster Plate Technology in High Density NAND Flash Memories for voltage Scaling-down and Zero Program Disturbance, Samsung electronics Co., LTD., pp. 238, 1996.

Chen, U.S. Appl. No. 11/272,335, titled "Reverse Coupling Effect With Timing Information," filed on Nov. 10, 2005.

U.S. Appl. No. 11/616,665, filed Dec. 27, 2006.

Response to Office Action dated Sep. 26, 2008, U.S. Appl. No. 11/616,665, filed Dec. 27, 2006.

Office Action dated Jun. 26, 2008 in U.S. Appl. No. 11/616,665.

International Search Report dated Jul. 2, 2008, PCT Patent Appl. No. PCT/US2007/088777, filed Dec. 24, 2007.

Written Opinion of the International Searching Authority dated Jul. 2, 2008, PCT Patent Appl. No. PCT/US2007/088777, filed Dec. 24, 2007.

Response to Office Action dated Feb. 12, 2009, U.S. Appl. No. 11/616,665, filed Dec. 27, 2006.

Office Action dated Nov. 18, 2008, U.S. Appl. No. 11/616,665, filed Dec. 27, 2006.

Notice of Allowance dated Apr. 3, 2009, U.S. Appl. No. 11/616,665, filed Dec. 27, 2006.

* cited by examiner

| Wordline | Upper/ Lower Page | All Bit Lines |
|---|---|---|
| WL3 | upper | Page 7 |
| | lower | Page 5 |
| WL2 | upper | Page 6 |
| | lower | Page 3 |
| WL1 | upper | Page 4 |
| | lower | Page 1 |
| WL0 | upper | Page 2 |
| | lower | Page 0 |

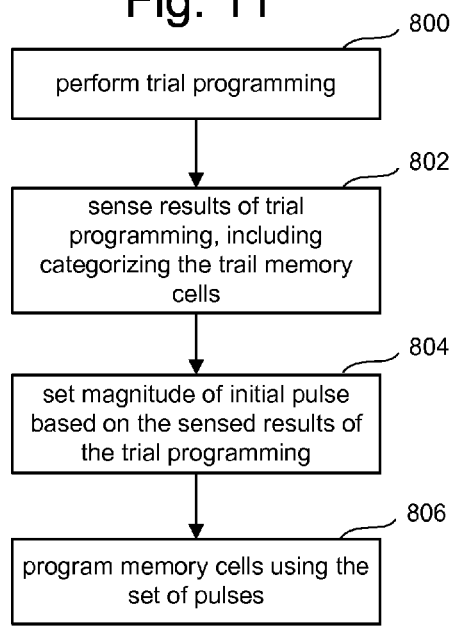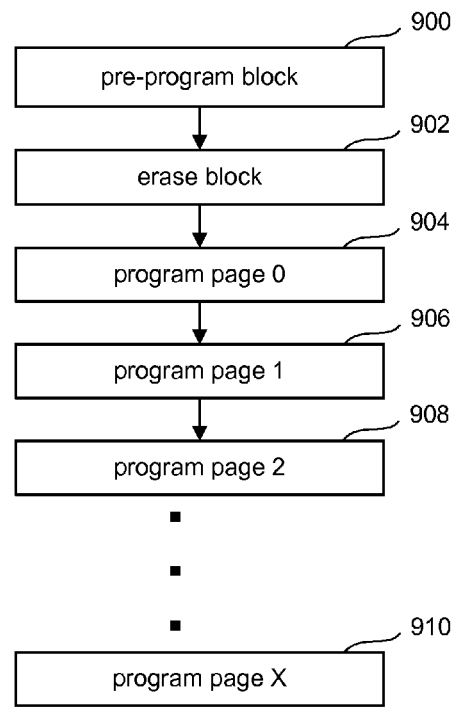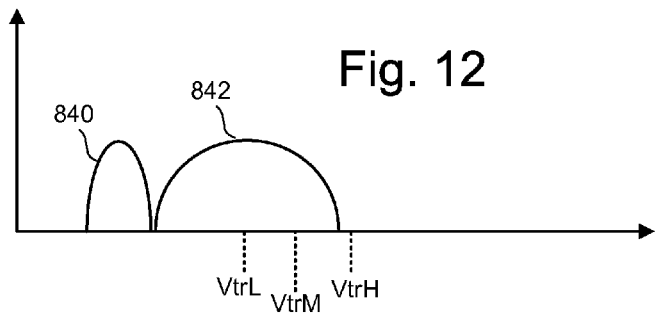

METHOD FOR PROGRAMMING WITH INITIAL PROGRAMMING VOLTAGE BASED ON TRIAL

CROSS-REFERENCE TO RELATED APPLICATIONS

The following application is cross-referenced and incorporated by reference herein in its entirety: U.S. patent application Ser. No. 11/616,665, entitled "Non-Volatile Storage System With Initial Programming Voltage Based On Trial," Inventors Teruhiko Kamei and Yan Li, filed on Dec. 27, 2006, incorporated herein by reference in its entirety.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety.

Typically, the program voltage applied to the control gate during a program operation is applied as a series of pulses. In one embodiment, the magnitude of the pulses is increased with each successive pulse by a predetermined step size. In the periods between the program pulses, verify operations are carried out. For arrays of multi-state flash memory cells, the memory cells may perform a verification step of each state to allow a determination of whether the memory cell has reached its target level. For example, a multi-state memory cell capable of storing data in four states may need to perform verify operations for three compare points.

The magnitude of the initial program pulse is typically set during the manufacturing or testing phase using a process called trimming. A part is programmed multiple times, each time using a different magnitude for the initial program pulse. When a particular magnitude for the initial program pulse results in a successful programming of the part, then the part is configured to use that magnitude for the initial program pulse during user operation.

The choice of the magnitude of the program voltage is a compromise. Too high of a value will result in some memory cells being over-programmed, while too low of a value will result in longer programming times. Typically, users of non-volatile memory desire that the memory program quickly.

In some prior art devices, the same program signal is used for new devices that have not been significantly used (also called fresh devices) as well as heavily used devices. However, as a non-volatile memory device undergoes many programming cycles, charge becomes trapped in the insulation between the floating gate and the channel region. This trapping of charge shifts the threshold voltage to a higher level, which allows the memory cell to program quicker. If the magnitude of the program signal is set too high, even though it does not result in over programming of a fresh device, as that device becomes more heavily used then that device may experience over programming. Thus, new devices will have their program voltage set low enough to avoid over programming when the device is older. This lowering of the magnitude of the program voltage will reduce the speed at which the fresh device programs data.

Additional factors that have made it difficult to optimize the magnitude of the program voltage include temperature, back pattern, wafer variations, lot variations, wafer/lot/chip positions, and other factors.

SUMMARY OF THE INVENTION

A trial programming process is performed for a first set of one or more non-volatile storage elements to test usage of the non-volatile storage system. Based on this trial programming, a programming signal is calibrated by dynamically adjusting its initial magnitude. The calibrated programming signal is then used to program a second set of non-volatile storage elements (which may or may not include the first set).

One embodiment includes performing at least partial programming on a first set of one or more non-volatile storage elements, identifying one or more threshold voltage ranges for the first set of non-volatile storage elements after the partial programming, setting an initial magnitude of a set of programming pulses based on the identified one or more threshold voltage ranges for the first set of non-volatile storage elements, and programming a second set of non-volatile storage elements using the set of programming pulses with the initial magnitude.

One embodiment includes applying one or more programming pulses to control gates of a first set of non-volatile storage elements, performing one or more sensing operations on the first set of non-volatile storage elements to determine magnitude information for threshold voltages of the first non-volatile storage elements, setting an initial magnitude of a set of programming pulses based on the determined magnitude information for threshold voltages of the trial non-volatile storage elements, and programming a second set of non-volatile storage elements using the set of programming pulses with the initial magnitude.

One example implementation comprises a plurality of non-volatile storage elements and one or more managing circuits in communication with the plurality of non-volatile storage elements for performing the processes discussed herein. For example, in one embodiment the one or more managing circuits perform at least partial programming for a first set of one or more of the non-volatile storage elements, sense magnitude information for one or more threshold voltages of the first set of one or more non-volatile storage elements and program a second set of the non-volatile storage elements using a programming signal having a value based on the sensed magnitude information.

In another embodiment, the one or more managing circuits apply at least partial programming to a first set of the non-volatile storage elements and classify the first set of non-volatile storage elements into ranges of threshold voltages due to the partial programming. The one or more managing circuits set an initial magnitude of a set of programming pulses based on the classifying and program a second set of the non-volatile storage elements using the set of programming pulses with the initial magnitude.

One example structure includes a plurality of NAND strings, a plurality of bit lines, a plurality of word lines, one or more voltage generation circuits in communication with the word lines, one or more bit line control circuits in communication with the bit lines, and a control circuit in communication with the one or more bit line control circuits and the one or more voltage generation circuits. Each NAND string includes a plurality of non-volatile storage elements. Each bit line is connected to one of the NAND strings. Each word line is connected to one non-volatile storage element of each of the NAND strings. The control circuit causes the one or more voltage generation circuits to apply one or more programming pulses to a word line selected for programming. The control circuit also causes the one or more bit line control circuits to perform one or more sensing operations for a first set of non-volatile storage elements connected to the word line selected for programming to determine magnitude information for threshold voltages of the first set of non-volatile storage elements after the one or more programming pulses. The control circuit sets an initial magnitude of a set of programming pulses based on the determined magnitude information and causes programming of a second set of non-volatile storage elements connected to the word line selected for programming using the set of programming pulses with the initial magnitude.

BRIEF DESCRIPTION OF THE DRAWINGS

FIG. 11 depicts a flow chart describing one embodiment of a process for programming non-volatile memory, with the initial programming voltage set based on a trial.

FIG. 12 depicts threshold voltage distributions.

FIG. 13 depicts a flow chart describing one embodiment of a process for programming non-volatile memory, with the initial programming voltage set based on a trial.

DETAILED DESCRIPTION

Figure 1:
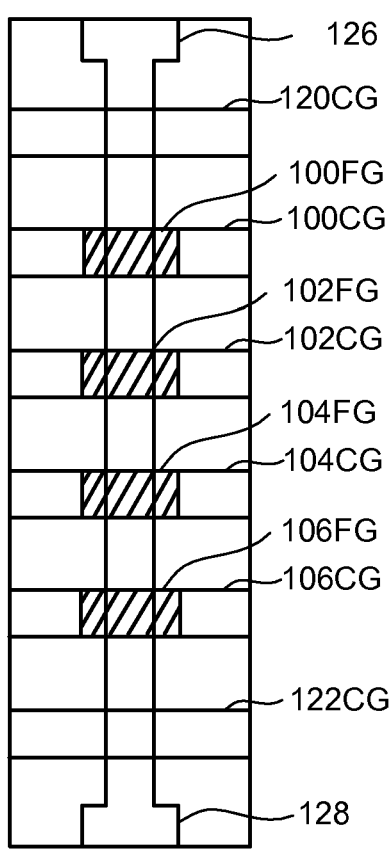
FIG. 1 is a top view of a NAND string.
Figure 2:
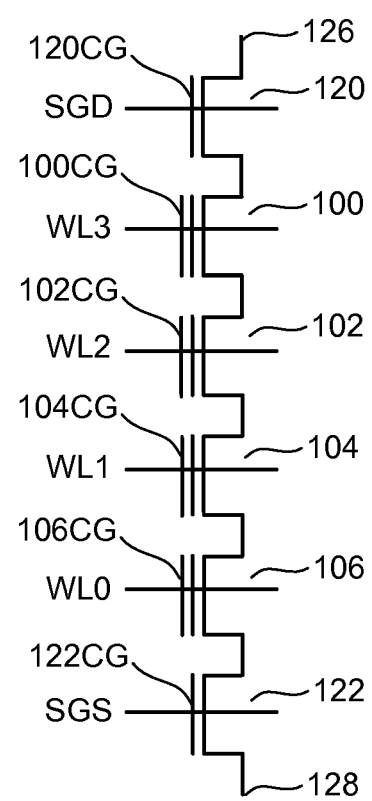
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111" The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
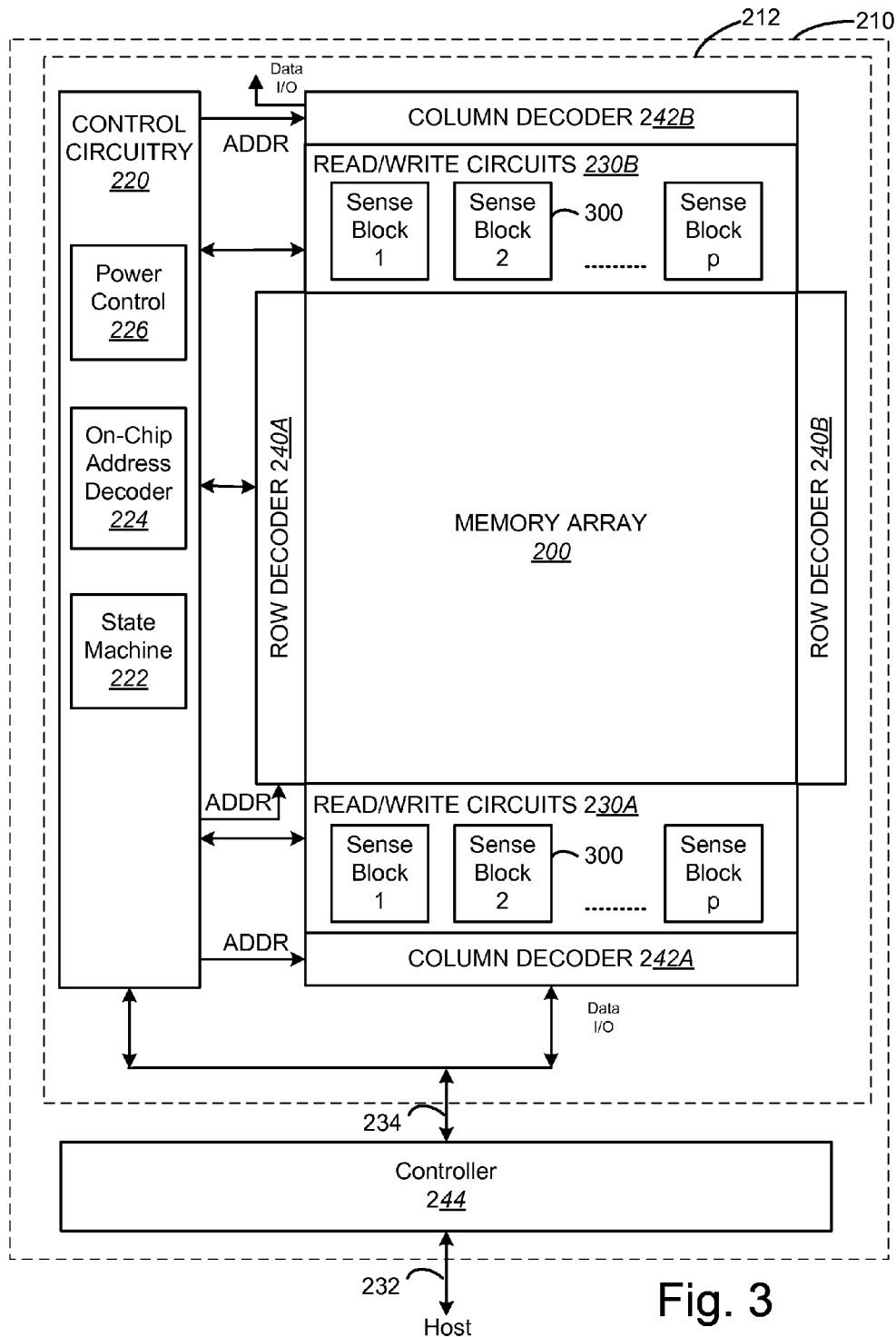
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
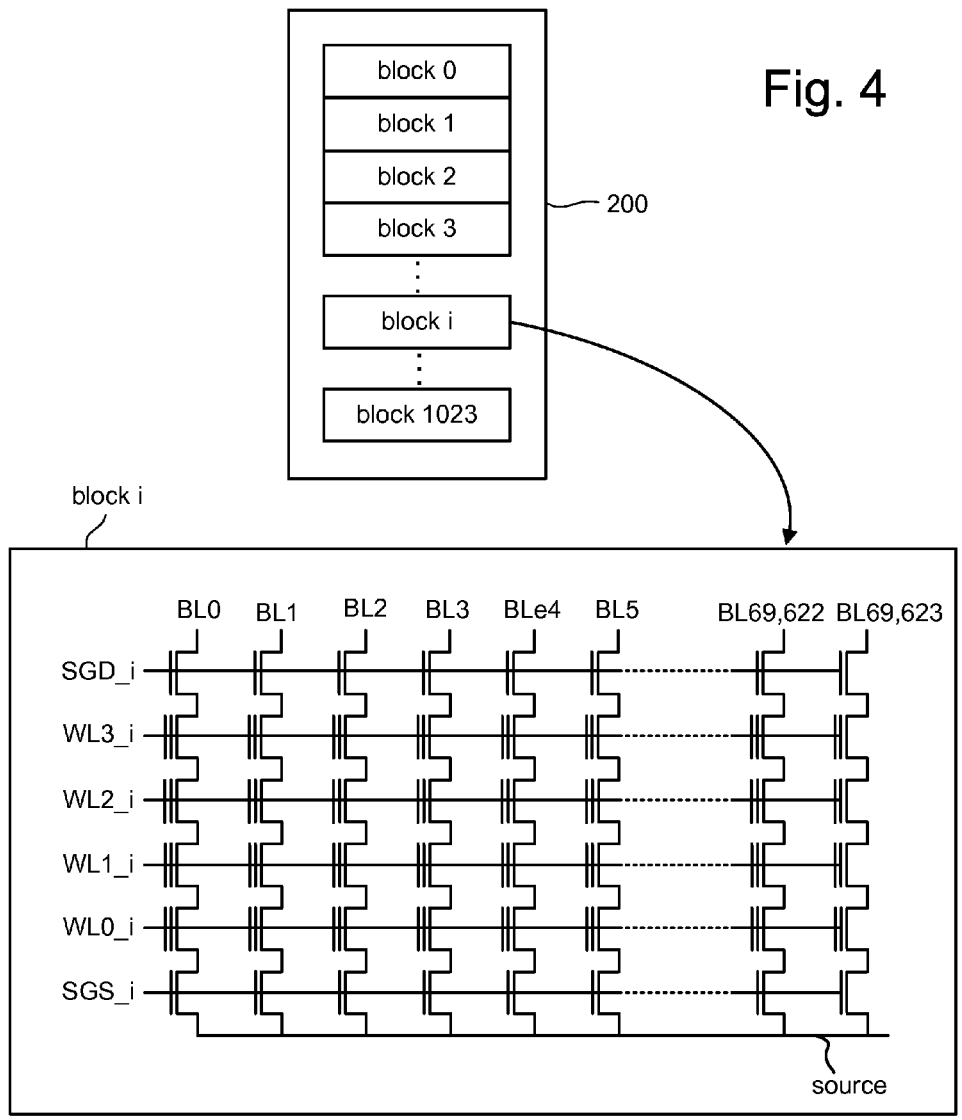
FIG. 4 is a block diagram depicting one embodiment of a memory array.

FIG. 4 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together.

A block contains a set of NAND stings which are accessed via bit lines (e.g., bit lines BL0-BL69623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

Each block is typically divided into a number of pages. In one embodiment, a page is a unit of programming. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks can also be used.

Figure 5:
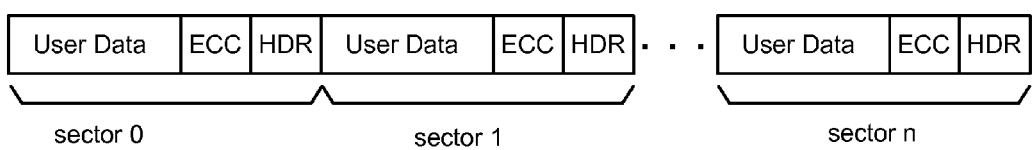
FIG. 5 depicts an example organization of data along a word line.

FIG. 5 shows one example of an arrangement of data in a page (e.g., from memory cells connected to a common word line). The page depicted in FIG. 5 includes n sectors, with each sector having User Data, ECC data and header (HDR) data. The ECC and HDR data is not data saved by the user, but is data saved by the system in association with the user's data. If the user data is M bits, the ECC data is N bits and the HDR data is P bits, then there are M memory cells (associated with M bit lines) storing user data, N memory cells (associated with N bit lines) storing ECC data, and P memory cells (associated with P bit lines) storing HDR data, all of which are connected to the same word line.

Figure 6:
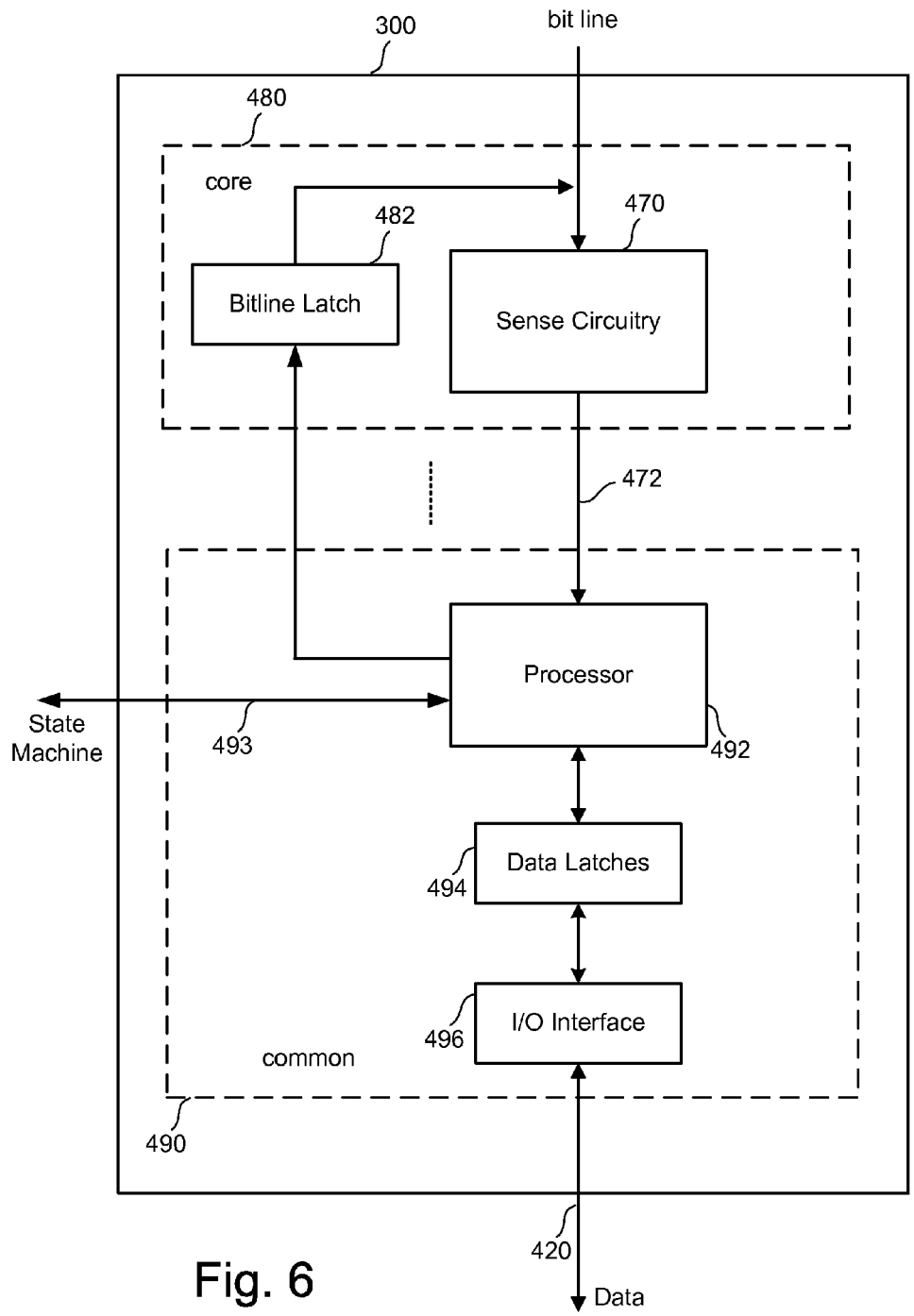
FIG. 6 is a block diagram depicting one embodiment of a sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed memory cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. Patent Aapplication Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figures 7, 9:
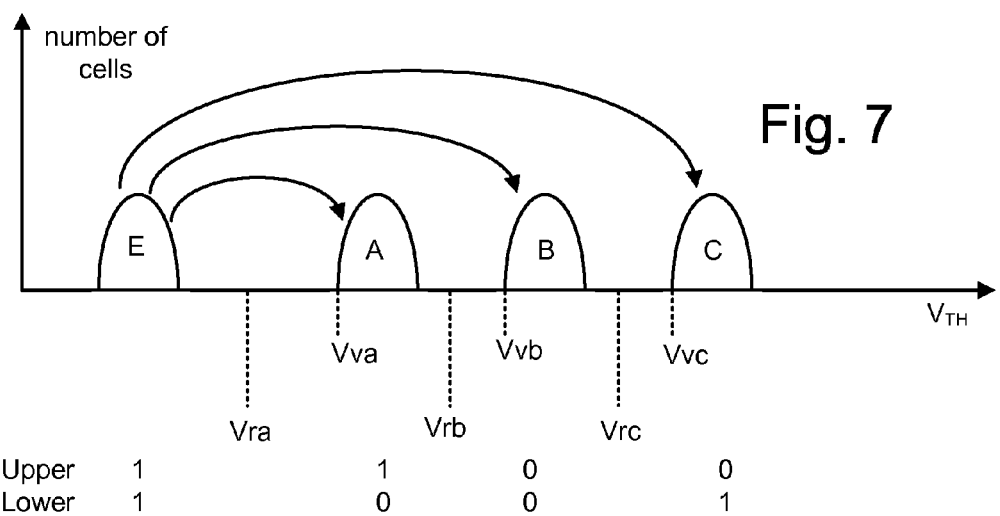
FIG. 7 depicts an example set of threshold voltage distributions and describes a process for programming non-volatile memory.
FIG. 9 is a table depicting one example of an order of programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 7 illustrates example threshold voltage distributions (or data states) for the memory cell array when each memory cell stores two bits of data. Other embodiment, however, may use more or less than two bits of data per memory cell (e.g., such as three bits of data per memory cell). FIG. 7 shows a first threshold voltage distribution E for erased memory cells. Three threshold voltage distributions A, B and C for programmed memory cells are also depicted. In one embodiment, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the memory cell and the threshold voltage levels of the cell depends upon the data encoding scheme adopted for the cells. One example assigns "11" to threshold voltage range E (state E), "10" to threshold voltage range A (state A), "00" to threshold voltage range B (state B) and "01" to threshold voltage range C (state C). However, in other embodiments, Gray code is not used.

In one embodiment, the two bits of data for each state are in different pages. With reference to state E of FIG. 7, both pages store a "1." With respect to state A, the upper page stores bit 1 and the lower page stores bit 0. With reference to state B, both pages store a "0." With reference to state C, the upper page stores bit 0 and the lower page stores bit 1.

In another embodiment, the two bits of data for each state are in the same page Although FIG. 7 shows four states, the present invention can also be used with other multi-state structures including those that include more or less than four states. For example, a memory cell that stores three bits of data may use eight data states.

FIG. 7 also shows three read reference voltages, Vra, Vrb and Vrc, for reading data from memory cells. By testing whether the threshold voltage of a given memory cell is above or below Vra, Vrb and Vrc, the system can determine what state the memory cell is in. Example values of Vra, Vrb and Vrc include Vra=0v, Vrb=1.25v, and Vrc=2.65v. Another set of examples includes Vra=0v, Vrb=1.35v, and Vrc=2.6v. Other values can also be used.

FIG. 7 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc. Example values of Vva, Vvb and Vvc include Vva=0.40v, Vvb=1.80v, and Vvc=3.35v. Another set of examples include Vva=0.5v, Vvb=1.9v, and Vvc=3.3v. Other values can also be used.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C. Full sequence programming is graphically depicted by the three curved arrows of FIG. 7.

Figure 8A:
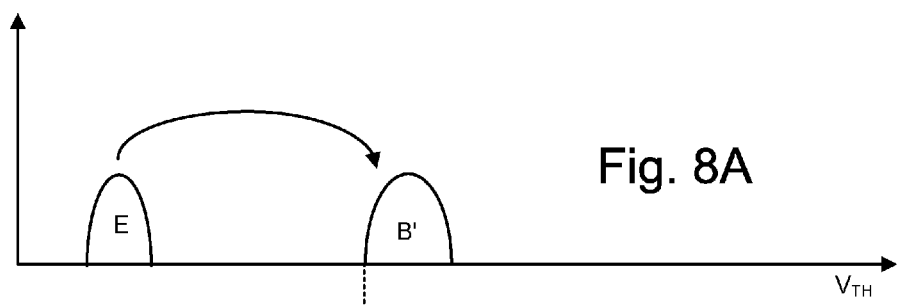
FIGS. 8A-C show various threshold voltage distributions and describe a process for programming non-volatile memory.
Figure 8B:
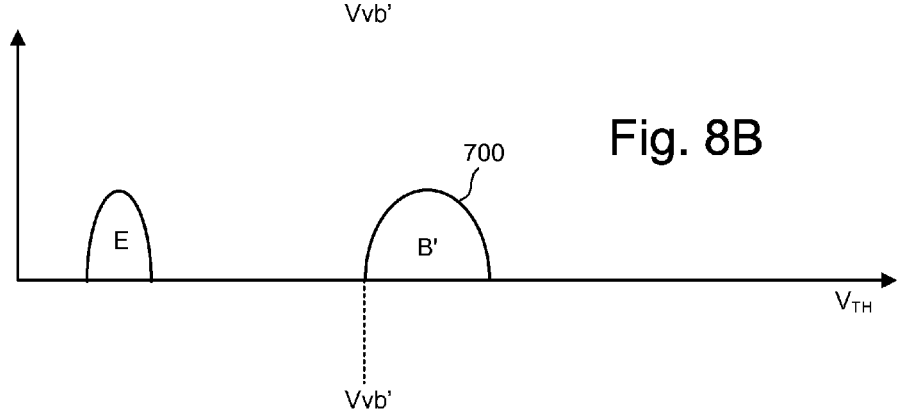
Figure 8C:
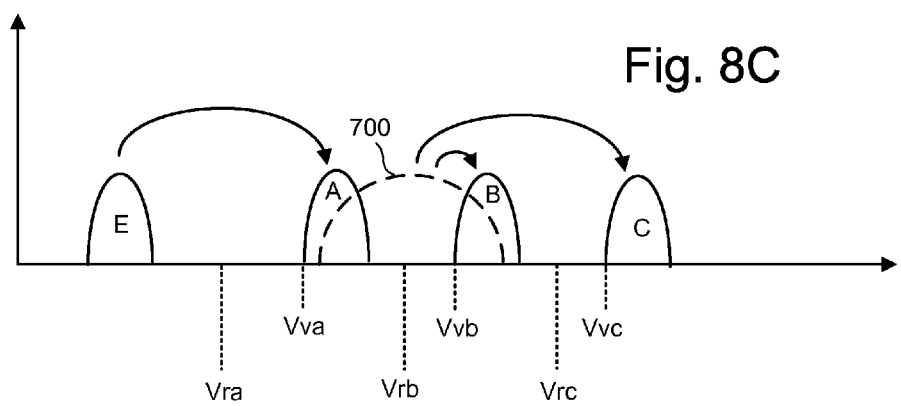

FIGS. 8A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each memory cell stores data in two pages. For reference purposes these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0.

The programming process of FIGS. 8A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (connected to WLn+1) in the NAND string will then be programmed with respect to its lower page. For example, after the lower page for a memory cell connected to WL0 is programmed, the lower page for a memory cell (the neighbor memory cell) on the same NAND string but connected to WL1 would be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted by intermediate threshold voltage distribution 700 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 700 and the upper page data is to remain at 1, then the memory cell will be programmed to final state B. If the memory cell is in intermediate threshold voltage distribution 700 and the upper page data is to become data 0, then the threshold voltage of the memory cell will be raised so that the memory cell is in state C. The process depicted by FIGS. 8A-C reduces the effect of coupling between floating gates because only the upper page programming of neighbor memory cells will have an effect on the apparent threshold voltage of a given memory cell.

FIG. 9 is a table that describes one embodiment of the order for programming memory cells utilizing the programming method of FIGS. 8A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

In one embodiment, a system can be set up to perform full sequence writing if enough data is being written to fill up a word line. If not enough data is being written, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Pub. No. 2006/0126390, filed on Dec. 14, 2004, inventors Sergy Anatolievich Gorobets and Yan Li, incorporated herein by reference in its entirety.

Although FIGS. 7-9 depict the use of four data states to store two bits of data per memory cell, other embodiments could use a different number of data states to store a different (or the same) number of bits of data per memory cell. In one example, eight data states are used to store three bits of data.

Figure 10:
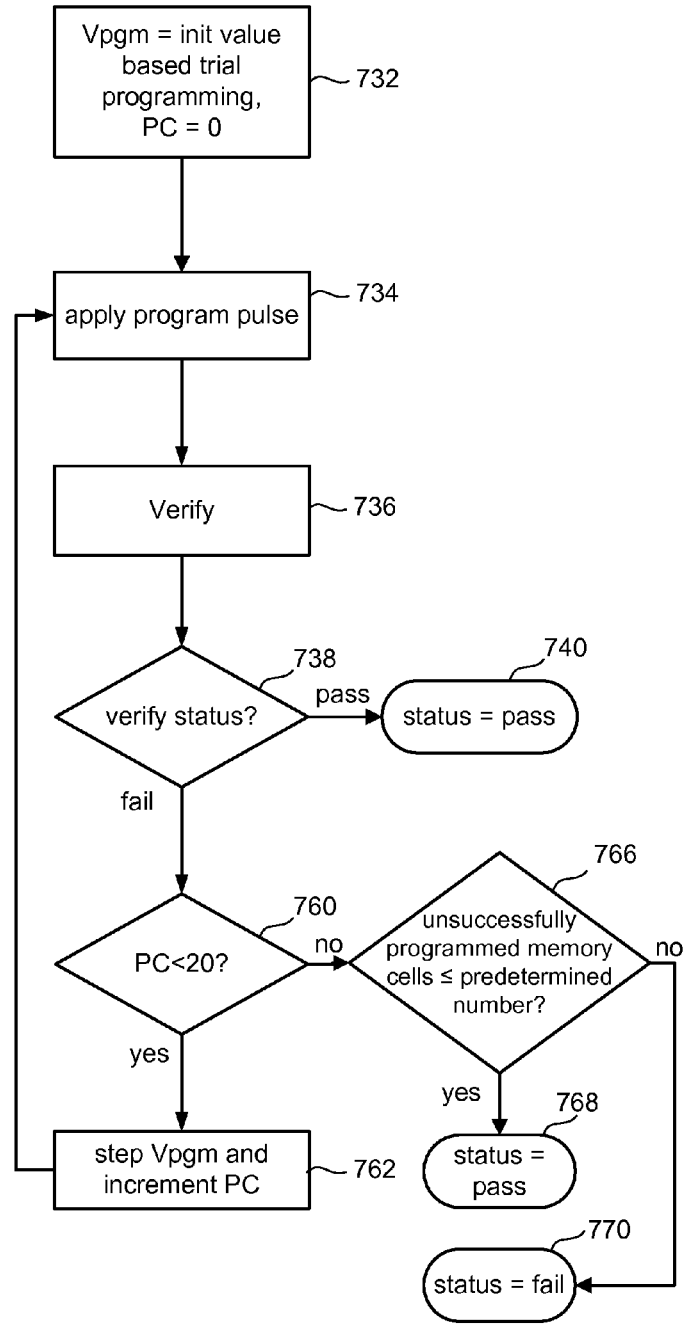
FIG. 10 depicts a flow chart describing one embodiment of a process for programming non-volatile memory.

FIG. 10 is a flow chart describing a programming process for programming memory cells connected to a selected word line. Thus, the process of FIG. 10 can be used to implement the full sequence programming of FIG. 7 for a selected word line, or one pass (either the first pass or the second pass) of the two pass programming technique of FIGS. 8A-C. The process of FIG. 10 can also be performed as one pass of a three pass programming technique for three pages of data (e.g., three bits of data per memory cell), or as one pass of another multi-pass programming technique. Many different programming techniques can be used with the present invention. In one embodiment, the process of FIG. 10 is performed by and/or at the direction of control circuitry 220 (state machine 222 provides the control and power control 226 provides the appropriate signals) and/or at the direction of controller 244.

Because a programming process may include programming multiple pages, a given programming process may include performing the process of FIG. 10 multiple times.

Note that in some embodiments (but not all), memory cells are programmed from the source side to the drain side. For example, looking at FIG. 4, word line WL0 is programmed first, followed by programming WL1, followed by programming WL2, etc.

In one embodiment, memory cells of are pre-programmed to a common threshold voltage level (to achieve even wear on the memory cells and/or a common starting point for erase) and erased (in blocks or other units) prior to programming. In some cases, the memory cells are erased without the pre-programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and source are also raised to a significant fraction of the erase voltage. A strong electric field is thus applied to the tunnel oxide layers of selected memory cells and the data of the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, a block, or another unit of cells. After the block of memory cells is erased, the various memory cells can be programmed as described herein. Subsequent to erasing, soft programming can be performed to narrow the distribution of erased threshold voltages for the erased memory cells. Some memory cells may be in a deeper erased state than necessary as a result of the erase process. Soft programming can apply a small number of programming pulses to move the threshold voltage of the erased memory cells to a tighter threshold voltage distribution. Note that the erasing and soft programming may be performed once for a block prior to each page being programmed.

In some embodiments, a programming process is started by the controller issuing a "data load" command to the state machine. Address data designating the page address is provided to the decoder circuitry and a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations. When the address and data are set, a "program" command is provided to the state machine by the controller. Triggered by the "program" command, the data will be programmed into the selected memory cells controlled by state machine 222 using a set of pulses applied to the appropriate word line based on the processes discussed herein, including the process of FIG. 10. Other arrangements can also be implemented.

In step 732 of FIG. 10, the programming voltage signal Vpgm (e.g., the set of programming pulses) is initialized to the starting magnitude. In traditional systems, the magnitude of the first program pulse is between 12-16v (other values can also be used), depending on the implementation. However, the system described herein dynamically sets the magnitude of the first program pulse each time the process of FIG. 10 is performed (or at other intervals) based on trial programming. More details of how the magnitude of the first program pulse is dynamically set based on trial programming is discussed below. Step 732 also includes initializing the program counter PC to 0. The program counter is maintained by state machine 222.

In step 734, one pulse of the program signal Vpgm is applied to the selected word line. In step 736, the data states of the selected memory cells are verified using the appropriate set of target levels (e.g., Vva, Vvb, Vvc). If it is detected that the threshold voltage of a selected memory cell has reached the appropriate target level, then the memory cell is locked out of future programming for the remainder of the process of FIG. 10 by raising its bit line voltage (e.g., to Vdd). If all memory cells being programmed have reached their target data states (step 738), then the programming process is complete and successful because all selected memory cells were programmed and verified to their target states. A status of "PASS" is reported in step 740. Note that in some implementations of step 738, it is checked whether at least a predetermined number of memory cells have been verified to have reached their target states. This predetermined number can be less than the number of all memory cells, thereby allowing the programming process to stop before all memory cells have reached their appropriate verify levels. The memory cells that are not successfully programmed can be corrected using error correction during the read process.

If, in step 738, it is determined that not all of the memory cells have reached their target states, then the programming process continues. In step 760, the program counter PC is checked against a program limit value. One example of a program limit value is 20; however, other values can be used. If the program counter PC is not less than the program limit value, then it is determined in step 766 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 768. In many cases, the memory cells that are not successfully programmed can be corrected using error correction during the read process. If, however, the number of unsuccessfully programmed memory cells is greater than the predetermined number, the program process is flagged as failed and a status of FAIL is reported In step 770.

If (in step 760) the program counter PC is less than the program limit value, then the magnitude of the Vpgm pulse is increased by the step size (e.g., 0.2-0.4 volt step size) and the program counter PC is incremented in step 762. After step 762, the process loops back to step 734 to apply the next Vpgm pulse.

FIG. 11 is a flow chart describing, from a high level, the process of programming data using a programming signal that is calibrated by adjusting its initial magnitude based on a trial programming process. The process of FIG. 11 can be performed at the direction of the state machine in response to a request to program data. In one embodiment, the process of FIG. 11 includes performing the method of FIG. 10 one or multiple times.

In step 800 of FIG. 11, trial programming is performed. In one embodiment, a request to program data causes the state machine to program data in to a particular page and each page includes a set of trial memory cells. The trial memory cells are at least partially programmed during the trial programming. In one embodiment, the trial memory cells are fully programmed during the trial programming.

In one example, the memory cells that will store user data for a page and the trial memory cells for that page are all connected to the same word line. The memory cells subjected to trial programming and the memory cells storing user data can be part of the same page, or different pages. The trial memory cells can be memory cells designated to store system data such as HDR data (see FIG. 5). In one implementation, the trial memory cells are the memory cells used to store a set of one or more flags that indicate whether the lower page and/or upper page data has been programmed for a word line according to the process of FIG. 8. Although the flags may store data in states E and C, these flags are considered as storing binary encoded data because the data is either in state E or state C only. In other embodiments, the flags can store data in any of the data states (multi-bit encoded). One embodiment of the trial programming process includes performing the trial programming on the memory cells storing the flag data. If the trial programming uses the memory cells storing the flag data then the trial programming is performed on memory cells that do not store user data. In one alternative, the trial programming is performed on memory cells that do store user data.

Other embodiments use redundant flash memory cells for the trial programming. Redundant memory cells are typically used to replace memory cells identified as malfunctioning (e.g., causing data errors).

In other embodiments, a set of memory cells can be included in a block for the specific purpose of being trial memory cells. In such a case, a block may contain 2-8 (or another number of) NAND strings that are only used for trial programming.

The number of trial memory cells can vary based on the implementation. In one embodiment, 2-8 trial memory cells can be used.

In one embodiment, the trial programming includes applying one programming pulse to the control gates of the trial memory cells. In other embodiments, more than one pulse is applied to the trial memory cells. The one programming pulse of the trial programming (or multiple pulses) will cause the threshold voltages of the trial memory cells to increase. To prevent over programming, the programming pulse of the trial programming can be made small enough to guarantee no over programming.

FIG. 12 show threshold voltage distribution 840 of erased trial memory cells prior to any trial programming. Threshold voltage distribution 842 represents the same trial memory cells after one programming pulse of trial programming. FIG. 12 also shows three voltage values VtrL, VtrM and VtrH which serve to differentiate slow, medium and fast (or new, middle and old) programming memory cells. In some implementations, VtrM is similar to Vva of FIG. 7 and VtrH is aligned with the high end edge of the threshold voltage distribution for state A. In other embodiments, VtrL, VtrM and VtrH can be other values.

Step 802 of FIG. 11 includes performing a set of sensing operations to determine the results of the trial programming and to categorize the trial memory cells into a set of threshold voltage ranges. For example, step 802 includes determining whether each of the trial memory cells have a threshold voltage less than VtrL (see FIG. 12), greater than or equal to VtrL and less than VtrM, greater than or equal to VtrM and less than VtrH, or greater than or equal to VtrH. In other embodiments, more or less than these four ranges can be used.

Step 804 of FIG. 11 includes setting the magnitude of the first pulse of the programming pulses Vpgm based on the trial programming. An indication of the magnitude of the first pulse can be stored in a register for the state machine and checked during step 732 (see FIG. 10). In one embodiment, the magnitude Vpgm(0) of the first pulse is set as follows:

$$Vpgm(0) = Vpgm\_nominal - 3(DAC), \text{ if } Vth\_trial \geq VtrH;$$

Vpgm(0)=Vpgm_nominal−2(DAC), if
VtrH>Vth_trial≧VtrM;

Vpgm(0)=Vpgm_nominal−1(DAC), if
VtrM>Vth_trial≧VtrL;

Vpgm(0)=Vpgm_nominal, if VtrL>Vth_trial;

where Vpgm_nominal is the standard magnitude of the first pulse without adjusting (can be set at 12-16 volts, depending on the design), Vth_trial is the result of the trial programming, and DAC is a voltage equal to the step size used in step 762 of FIG. 10. In other embodiments, DAC can be other values different than the step size.

In another embodiment, the magnitude Vpgm(0) of the first pulse is set as follows:

Vpgm(0)=Vpgm_nominal, if Vth_trial≧VtrH;

Vpgm(0)=Vpgm_nominal+1(DAC), if
VtrH>Vth_trial≧VtrM;

Vpgm(0)=Vpgm_nominal+2(DAC), if
VtrM>Vth_trial>Vth_trial≧VtrL;

Vpgm(0)=Vpgm_nominal+3(DAC), if
VtrL>Vth_trial;

Many other arrangements can also be used. The exact scheme for adjusting the magnitude Vpgm(0) of the first pulse can depend on the particular storage system being implemented.

In one embodiment, the results of step 802 are averaged to create Vth_trial. For example, if six trial memory cells were measured in step 802 to have their threshold voltages in the third range (VtrM>Vth_trial≧VtrL) and six trial memory cells were measured in step 802 to have their threshold voltages in the first range (Vth_trial≧VtrH), then the average is the second range and Vth_trial would be set to indicate the range VtrH>Vth_trial≧VtrM.

In another embodiment, Vth_trial is set to indicate the results from the fastest memory cell. For example, if three trial memory cells were measured to be in the fourth range (Vth_trial<VtrL), six trial memory cells were measured to have their threshold voltages in the third range (VtrM>Vth_trial≧VtrL), six trial memory cells were measured to have their threshold voltages in the second range (VtrH>Vth_trial≧VtrM), and one trial memory cell was measured to have its threshold voltage in the first range (Vth_trial≧VtrH), then Vth_trial is set to indicate the first range Vth_trial≧VtrH.

After setting the magnitude of the first programming pulse, the memory cells that are to store user data are programmed in step 806 using a set of programming pulse with the first pulse having the magnitude set in step 804. The programming of step 806 includes one or more iterations of the process of FIG. 10 to program data according to the methods described with respect to FIGS. 7 and 8, or other programming methods.

FIG. 13 describes an example embodiment for implementing the concepts of FIG. 11, which includes programming data using a programming signal that is calibrated by adjusting its initial magnitude based on a trial programming process. In step 900 of FIG. 13, in response to a specific request to program specific data, the state machine will pre-program all memory cells of a block of data to state E. In step 902, the of memory cells of the block will be erased. Page 0 will be programmed in step 904, page 1 will be programmed in step 906, page 2 will be programmed in step 908, . . . , page X will be programmed in step 910.

In one embodiment, the process of FIG. 13 programs word lines in the direction from the source to the drain/bit line, and each word line stores data for one page. In another embodiment, each word line stores more than one page of data. In an embodiment associated with FIGS. 8A-8C, the order of programming pages (steps 904, 906, 908, . . . 910) can be re-arranged according to the table of FIG. 9. Other orders can also be used.

Figure 14:
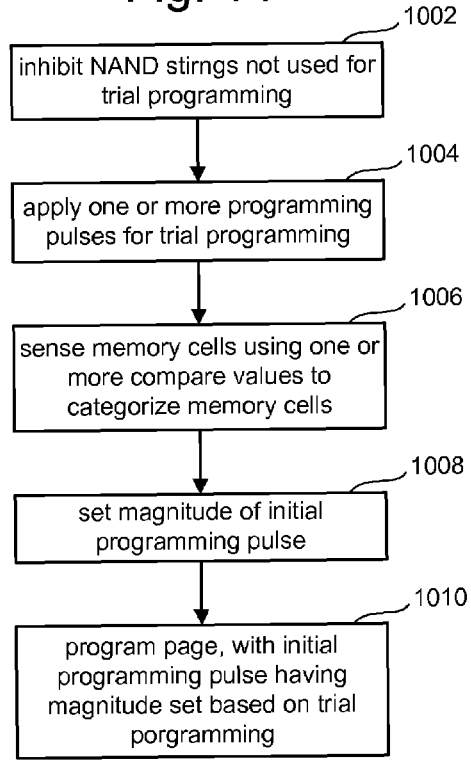
FIG. 14 depicts a flow chart describing one embodiment of a process for programming a page of data.

Each step 904, 906, 908, . . . 910 of programming a page includes performing the process of FIG. 14. As described above, in one embodiment each word line (or each page) includes a first set of memory cells for storing user data and a second set of memory cells for trial programming. The first set of memory cells and the second set of memory cells are all connected to the same word line. For example, each memory cell of the first set and the second set are on different NAND strings. In one embodiment, the last 2-8 bit lines (or another set of bit lines) are connected to NAND strings of trial memory cells. In step 1002 of FIG. 14, the NAND strings that are not used for trial programming (e.g., they store user data) are inhibited from programming by raising their respective bit line voltages to an inhibit level, such as Vdd (e.g., 3.5 volts). In step 1004, a programming pulse is applied to the word line (and, thus, to the control gates of the trial memory cells) to perform the trial programming. In some embodiments, the trial programming may include using more than one programming pulse. In step 1006, the memory cells that were not inhibited are sensed (as described above) to determine information about the magnitude of their threshold voltages. For example, read operations can be performed at VtrL, VtrM, and VtrH, and the memory cells can be categorized accordingly into one of the four (or three) ranges discussed above. In step 1008, the magnitude of the initial programming pulse can be set, as described above. In step 1010, one or more pages of data are programmed as per the process of FIG. 10. Step 1010, can also include completing the programming of system information into the memory cells that were used for trial programming.

In some embodiments, the memory cells programmed in step 1010 include the trial memory cells. That is, some embodiments perform the trial programming on memory cells targeted to store user data and, in that case, step 1010 includes completing the programming of user data into the memory cells that were subjected to trial programming.

Figure 15:
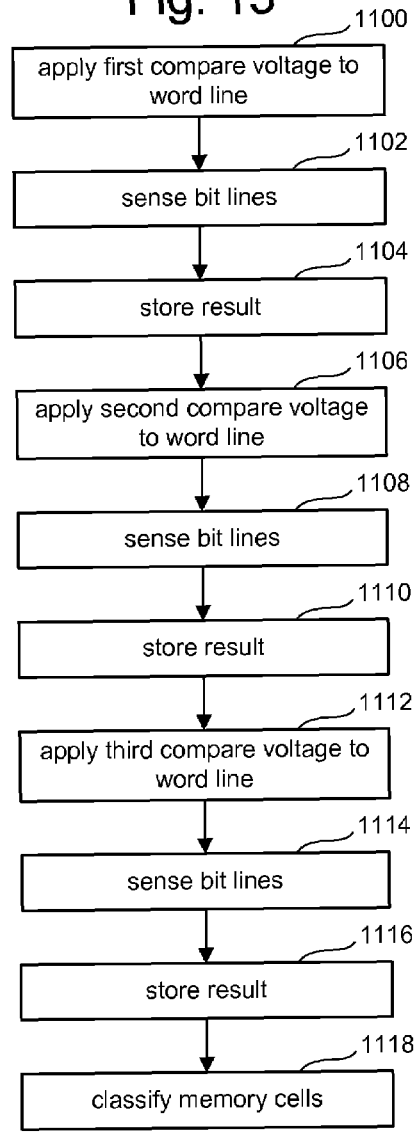
FIG. 15 depicts a flow chart describing one embodiment of a process for sensing non-volatile memory.

FIG. 15 is a flow chart describing a process for sensing data for a selected word line. The process of FIG. 15 can be used during step 802 (FIG. 11) and step 1006 (FIG. 14). In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not. Additional information about the read operations and sense amplifiers can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

In step 1100 of FIG. 15, a first compare voltage (e.g., VtL) is applied to the selected word line WLn. In step 1102, the bit lines associated with the page are sensed to determine whether the addressed memory cells turn on or do not turn on based on the application of the first compare voltage to their control gates. Bit lines that conduct indicate that the memory cells turned on; therefore, the threshold voltages of those memory cells are below the first compare voltage. In step 1104, the result of the sensing for the bit lines is stored in the appropriate latches for those bit lines. Instead of sensing the bit lines voltage, capacitors can be sensed in the sense amplifier, as mentioned above.

In step 1106, a second compare voltage (e.g., VtM) is applied to the selected word line WLn. In step 1108, the bit lines associated with the page are sensed to determine whether the addressed memory cells turn on or do not turn on based on the application of the first compare voltage to their control gates. Bit lines that conduct indicate that the memory cells were turned on; therefore, the threshold voltages of those memory cells are below the second compare voltage. In step 1110, the result of the sensing for the bit lines is stored in the appropriate latches for those bit lines. Instead of sensing the bit lines voltage, capacitors can be sensed in the sense amplifier, as mentioned above.

In step 1112, a third compare voltage (e.g., VtH) is applied to the selected word line WLn. In step 1114, the bit lines associated with the page are sensed to determine whether the addressed memory cells turn on or do not turn on based on the application of the first compare voltage to their control gates. Bit lines that conduct indicate that the memory cells were turned on; therefore, the threshold voltages of those memory cells are below the second compare voltage. In step 1116 the result of the sensing for the bit lines is stored in the appropriate latches for those bit lines. Instead of sensing the bit lines voltage, capacitors can be sensed in the sense amplifier, as mentioned above.

In step 1118, the memory cells connected to the selected word lines are classified based on the results of the three sensing operations. For example, the memory cells are tested as to whether they are in a first range of threshold voltages below VtL, a second range of threshold voltages greater than or equal to VtL and less than VtM, a third range of threshold voltages greater than or equal to VtM and less than VtH, or a fourth range of threshold voltages greater than or equal to VtH. In another embodiment, the first range and the second range can be combined to a single range. More or less than four ranges can be used, and other ranges can be used. In one embodiment, the classification is performed by processor 492 at the end of the process. In another embodiment, processor 492 determines the ranges on the fly, such that as each sensing operation is performed the data analysis is updated. Processor 492 will store the determined range indications in the appropriate latches for each bit line. In other embodiments, the state machine or other component can be used to determine the ranges.

Figure 16:
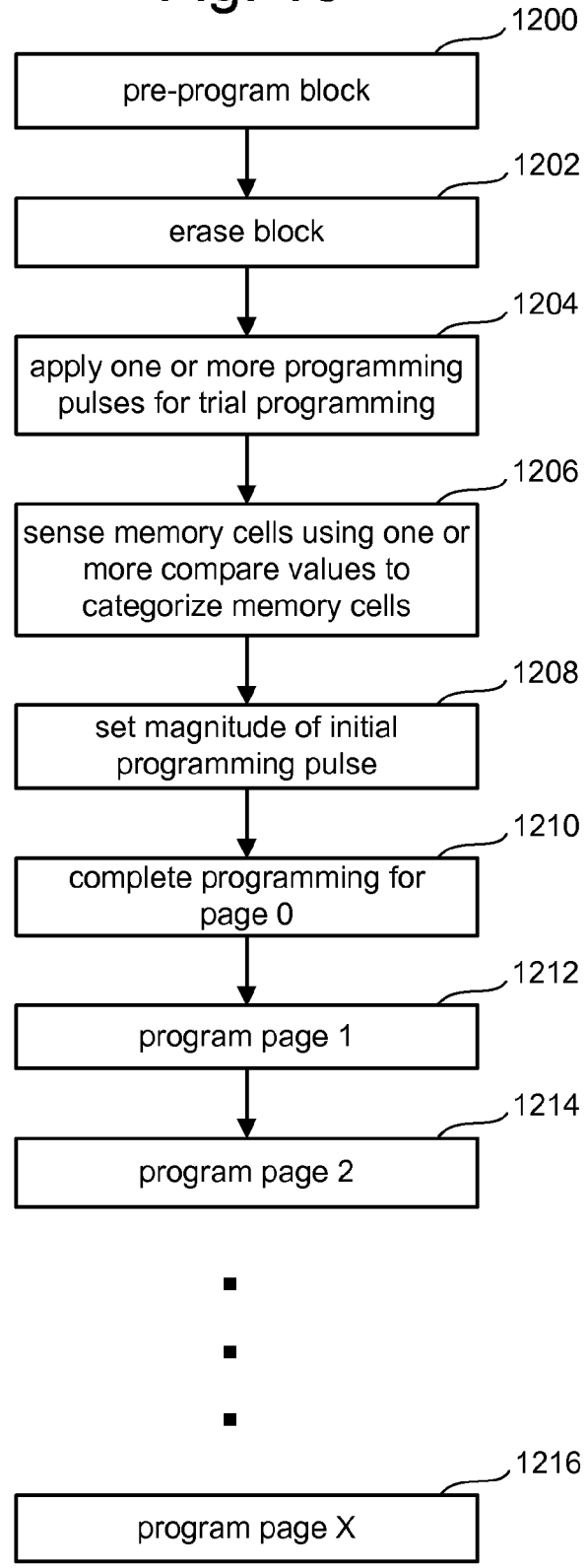
FIG. 16 depicts a flow chart describing one embodiment of a process for programming non-volatile memory, with the initial programming voltage set based on a trial.

FIG. 16 describes another embodiment for implementing the concepts of FIG. 11, which includes programming data using a programming signal that is calibrated by adjusting its initial magnitude based on a trial programming process. In the embodiment of FIG. 16, trial programming will be performed on the memory cells connected to WL0, the word line adjacent to the source line. In one embodiment, WL0 is also the first word line to be programmed. In one example, trial programming will be performed on all memory cells connected to WL0. In another example, trial programming will be performed on a subset of memory cells connected to WL0, such as the flags discussed above, a different group of memory cells storing other system data or a subset of memory cells storing user (multi-state or binary) data. Based on the trial programming performed on WL0, the magnitude of the first programming pulse will be set for the remainder of the block of memory cells during the current programming process (response to the current programming request(s)). Future programming processes will reset the magnitude of the first programming pulse based on new trial programming.

In step 1200 of FIG. 16, in response to a specific request to program specific data, the state machine will pre-program all memory cells of a block of data to state E. In step 1002, the memory cells of the block will be erased. In step 1204, a programming pulse is provided to the control gates of the memory cells involved in the trial programming by applying the programming pulse to WL0 (since the word line is connected to the control gates of the memory cells). If not all of the memory cells connected to WL0 participate in the trial programming, then those memory cells not participating in the trial programming will have their bit lines raised to Vdd while the memory cells participating in the trial programming will have their bit lines at 0 volts. In step 1206, the memory cells involved in the trial programming are sensed (as described above) to determine information about the magnitude of their threshold voltages. For example, read operations can be performed at VtrL, VtrM, and VtrH, and the memory cells can be categorized accordingly into one of the four (or three) ranges, as discussed above with respect to FIG. 15. In step 1208, the magnitude of the initial programming pulse can be set, as described above. This magnitude of the initial programming pulse can subsequently be used to program memory cells connected to other word lines for the current block. In step 1210, programming for page 0 on WL0 (or all of WL0) is completed. Programming for page 0 may have been started (an, in some cases, completed) by the trial programming; therefore, that programming is completed in step 1210. Page 1 will be programmed in step 1212, page 2 will be programmed in step 1214, . . . , page X will be programmed in step 1216. In one embodiment, steps 1212, 1214, . . . , 1216 each include performing the process of FIG. 10 and each include using a first pulse (of the set of pulses) having a magnitude set in step 1208. For example, if sixty four pages are programmed then there will be sixty four first pulses (one for each page) having a magnitude equal to that which was set in step 1208.

In one embodiment, the process of FIG. 16 programs word lines in the direction from the source to the drain/bit line, and each word line stores data for one page. In another embodiment, each word line stores more than one page. In an embodiment associated with FIGS. 8A-8C, the order of programming pages (steps 1212, 1214, . . . 1216) can be rearranged according to the table of FIG. 9. Other orders can also be used. Additionally, other embodiments can use other pages or other word lines for the trial programming.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming non-volatile storage, comprising:
    performing at least partial programming on a first set of one or more non-volatile storage elements;
    classifying said first set of one or more non-volatile storage elements into ranges of threshold voltages after said performing at least partial programming;
    dynamically determining and setting a magnitude of a first pulse of a set of programming pulses based on said classifying; and
    programming a second set of non-volatile storage elements using said set of programming pulses with said first pulse having said magnitude.

2. A method according to claim 1, wherein:
    said performing at least partial programming includes applying a program pulse to control gates for said first set of one or more non-volatile storage elements;
    said classifying includes performing sense operations using multiple threshold voltage compare values and choosing ranges based on said sensing;
    said set of programming pulses is associated with different first pulse magnitudes, each of said different first pulse magnitudes is associated with one of said threshold voltage ranges; and
    said setting said magnitude of said first pulse chooses one of said different first pulse magnitudes based on said sense operations.

3. A method according to claim 1, wherein:
    said first set of one or more non-volatile storage elements includes multiple non-volatile storage elements; and
    said initial magnitude is set based on a range that indicates fastest programming.

4. A method according to claim 1, wherein:
    said first set of one or more non-volatile storage elements includes multiple non-volatile storage elements; and
    said magnitude is set based on an average of said classified ranges.

5. A method according to claim 1, wherein:
    said first set of one or more non-volatile storage elements includes multiple non-volatile storage elements; and
    said magnitude is set based on a mathematical function of said classified ranges.

6. A method according to claim 1, wherein:
    said first set of one or more non-volatile storage elements do not store user data; and
    said second set of one or more non-volatile storage elements store user data.

7. A method according to claim 6, wherein:
    said first set of one or more non-volatile storage elements are connected to said second set of one or more non-volatile storage elements.

8. A method according to claim 6, wherein:
    said first set of one or more non-volatile storage elements and said second set of one or more non-volatile storage elements are connected to a common word line.

9. A method according to claim 8, wherein:
    said first set of one or more non-volatile storage elements and said second set of one or more non-volatile storage elements store data in a common page.

10. A method according to claim 1, wherein:
    said first set of one or more non-volatile storage elements store user data.

11. A method according to claim 1, wherein:
    said first set of one or more non-volatile storage elements are connected to a selected word line and are in a particular block; and
    said second set of one or more non-volatile storage elements are in said particular block and are connected to a first word line for said particular block.

12. A method according to claim 1, wherein:
    said step of programming said second set of non-volatile storage elements also programs said first set of non-volatile storage elements.

13. A method according to claim 1, wherein:
    said second set of non-volatile storage elements includes said first set of non-volatile storage elements and additional non-volatile storage elements.

14. A method according to claim 1, wherein:
    said performing at least partial programming, classifying, determining, setting, and programming a second set are performed in response to a particular request to program particular data.

15. A method according to claim 1, wherein:
    said first set of non-volatile storage elements and said second set of non-volatile storage elements are NAND flash memory devices.

16. A method according to claim 1, wherein: p1 said first set of non-volatile storage elements and said second set of non-volatile storage elements are multi-state flash memory devices.

17. A method according to claim 1, wherein:
    each programming pulse of said set of programming pulses has a different magnitude; and
    each programming pulse of said set of programming pulses differs in magnitude from a previous programming pulse by a constant amount.

18. A method according to claim 1, wherein:
    said performing at least partial programming includes applying a program pulse to a word line connected to said first set of one or more non-volatile storage elements and said second set of non-volatile storage elements while inhibiting at least some of said second set of non-volatile storage elements from programming; and
    said programming said second set of non-volatile storage elements includes applying said set of programming pulses with said initial magnitude to said word line connected to said first set of one or more non-volatile storage elements and said second set of non-volatile storage elements.

19. A method according to claim 1, wherein:
    said second set of one or more non-volatile storage elements is a different set than said first set of one or more non-volatile storage elements.

20. A method according to claim 1, wherein:
said first pulse is a first programming pulse applied to program said second set of non-volatile storage elements during said programming of said second set of non-volatile storage elements.

21. A method for programming non-volatile storage, comprising:
applying one or more programming pulses to control gates of a first set of non-volatile storage elements;
performing one or more sensing operations on said first set of non-volatile storage elements to determine magnitude information for threshold voltages of said first non-volatile storage elements;
classifying said first set of non-volatile storage elements into threshold voltage ranges after said performing said one or more sensing operations;
dynamically setting an initial magnitude value of a set of programming pulses based on said classifying; and
programming a second set of non-volatile storage elements using said set of programming pulses with said initial magnitude value, said second set of non-volatile storage elements is a different set than said first set of non-volatile storage elements.

22. A method according to claim 21, wherein:
said first set of one or more non-volatile storage elements and said second set of one or more non-volatile storage elements store data in a common block; and
said steps of applying, performing, setting and programming are performed in response to a particular request to program particular data.

23. A method according to claim 21, wherein:
said first set of one or more non-volatile storage elements do not store user data; and
said second set of one or more non-volatile storage elements store user data.

24. A method according to claim 21, wherein:
said programming said second set of non-volatile storage elements includes applying a first pulse during said programming said second set of non-volatile storage elements, said first pulse is applied at said initial magnitude value based on said classifying and said setting.

25. A method according to claim 21, wherein:
said first set of one or more non-volatile storage elements and said second set of one or more non-volatile storage elements are connected to a common word line.

26. A method according to claim 21, wherein:
said second set of one or more non-volatile storage elements are connected to a selected word line and are in a particular block; and
said first set of one or more non-volatile storage elements are in said particular block and are connected to a first word line for said particular block.

27. A method for programming non-volatile storage, comprising:
performing at least partial programming for a first set of one or more non-volatile storage elements;
sensing magnitude information for one or more threshold voltages of said first set of non-volatile storage elements, said sensed magnitude information corresponds to at least a first result or a second result for said first set of non-volatile storage elements, said first result is associated with a first initial pulse magnitude value, said second result is associated with a second initial pulse magnitude value; and programming a second set of non-volatile storage elements by applying a set of programming pulses to said second set of non-volatile storage elements, a first programming pulse applied to said second set of non-volatile storage elements during said programming of said second set of non-volatile storage elements is at said first initial pulse magnitude value if said sensed magnitude information corresponds to said first result, said first programming pulse applied to said second set of non-volatile storage elements during said programming of said second set of non-volatile storage elements is at said second initial pulse magnitude value if said sensed magnitude information corresponds to said second result.

28. A method according to claim 27, wherein:
said first set of non-volatile storage elements and said set of second non-volatile storage elements are connected by a common control line.

29. A method according to claim 27, wherein:
said sensing magnitude information includes classifying said first set of non-volatile storage elements into threshold voltage ranges, a first threshold voltage range corresponds to said first result, a second threshold voltage range corresponds to said second result.

30. A method according to claim 29, wherein:
said first set of non-volatile storage elements do not store user data; and
said second set of non-volatile storage elements store user data.

31. A method for programming non-volatile storage, comprising:
performing at least partial programming on a first set of one or more non-volatile storage elements;
classifying said first set of one or more non-volatile storage elements into ranges of threshold voltages after said performing at least partial programming;
dynamically determining and setting an initial magnitude of a programming signal based on said classifying; and
programming a second set of non-volatile storage elements using said programming signal with said initial magnitude.

* * * * *

UNITED STATES PATENT AND TRADEMARK OFFICE
CERTIFICATE OF CORRECTION

PATENT NO. : 7,551,482 B2
APPLICATION NO. : 11/616647
DATED : June 23, 2009
INVENTOR(S) : Kamei It is certified that error appears in the above-identified patent and that said Letters Patent is hereby corrected as shown below:

Col. 20, line 40: after "wherein" and before "said" delete "p1"

Col. 21, line 28: after "performing" and before "and" delete "sefting" and replace with --setting--

Signed and Sealed this

Tenth Day of November, 2009

David J. Kappos
*Director of the United States Patent and Trademark Office*